United States Patent
Fan et al.

(10) Patent No.: US 10,825,757 B2
(45) Date of Patent: Nov. 3, 2020

(54) SEMICONDUCTOR DEVICE AND METHOD WITH CLIP ARRANGEMENT IN IC PACKAGE

(71) Applicant: Nexperia B.V., Nijmegen (NL)

(72) Inventors: Haibo Fan, Hong Kong (HK); Pompeo v Umali, Hong Kong (HK); Tim Boettcher, Lauenbrueck (DE); Wai Wong Chow, Tai Po (HK)

(73) Assignee: NEXPERIA B.V., Nijmegen (NL)

( * ) Notice: Subject to any disclaimer, the term of this patent is extended or adjusted under 35 U.S.C. 154(b) by 0 days.

(21) Appl. No.: 15/382,805

(22) Filed: Dec. 19, 2016

(65) Prior Publication Data
US 2018/0174951 A1    Jun. 21, 2018

(51) Int. Cl.
*H01L 23/495* (2006.01)
*H01L 23/31* (2006.01)
(Continued)

(52) U.S. Cl.
CPC .... *H01L 23/49568* (2013.01); *H01L 21/4825* (2013.01); *H01L 23/3114* (2013.01);
(Continued)

(58) Field of Classification Search
CPC ......... H01L 23/49568; H01L 23/49513; H01L 23/49541; H01L 23/3114; H01L 23/49524; H01L 21/4825
See application file for complete search history.

(56) References Cited

U.S. PATENT DOCUMENTS

| | | | | |
|---|---|---|---|---|
| 4,994,412 A | * | 2/1991 | Kalfus | ............... H01L 23/49537 438/123 |
| 5,001,545 A | * | 3/1991 | Kalfus | ............... H01L 23/49562 257/773 |

(Continued)

FOREIGN PATENT DOCUMENTS

| DE | 3528427 A1 | 4/1987 |
|---|---|---|
| EP | 2930747 A1 | 7/2014 |

(Continued)

OTHER PUBLICATIONS

Matt Romig and Ozzie Lopez, "3D packaging advancements drive performance, power and density in power devices," Texas Instruments White Paper (Jul. 2011).

(Continued)

*Primary Examiner* — Robert K Carpenter
(74) *Attorney, Agent, or Firm* — Ohlandt, Greeley, Ruggiero & Perle, LLP

(57) ABSTRACT

Various example embodiments concern an integrated circuit (IC) package having a clip with a protruding tough-shaped finger portion. The clip can be used in various IC packages including, for example, soft-soldered compact power packages such as rectifiers with specified surge current capability. Such embodiments can be implemented to allow for a visual inspection capability of the soldering area for connecting a lead frame, via the clip, to a surface of the IC package die, while still providing sufficient thermal mass to limit the temperature increase during forward surge current loads. This results in a simple to manufacture design without compromising too much on performance.

16 Claims, 3 Drawing Sheets

(51) Int. Cl.
*H01L 21/48* (2006.01)
*H01L 23/00* (2006.01)

(52) U.S. Cl.
CPC .. *H01L 23/49513* (2013.01); *H01L 23/49524* (2013.01); *H01L 23/49537* (2013.01); *H01L 23/49541* (2013.01); *H01L 23/49562* (2013.01); *H01L 24/37* (2013.01); *H01L 24/40* (2013.01); *H01L 24/84* (2013.01); *H01L 23/3107* (2013.01); *H01L 24/83* (2013.01); *H01L 2224/06181* (2013.01); *H01L 2224/26145* (2013.01); *H01L 2224/27013* (2013.01); *H01L 2224/29116* (2013.01); *H01L 2224/32245* (2013.01); *H01L 2224/33181* (2013.01); *H01L 2224/37147* (2013.01); *H01L 2224/40095* (2013.01); *H01L 2224/40245* (2013.01); *H01L 2224/40491* (2013.01); *H01L 2224/73263* (2013.01); *H01L 2224/83815* (2013.01); *H01L 2224/8491* (2013.01); *H01L 2224/92246* (2013.01); *H01L 2924/10253* (2013.01); *H01L 2924/10329* (2013.01); *H01L 2924/14* (2013.01); *H01L 2924/181* (2013.01)

(56) References Cited

U.S. PATENT DOCUMENTS

| | | | |
|---|---|---|---|
| 5,110,761 | A | 5/1992 | Kalfus et al. |
| 8,354,740 | B2 | 1/2013 | Liu et al. |
| 8,680,658 | B2 | 3/2014 | Shi et al. |
| 9,070,671 | B2 | 6/2015 | Jiang |
| 9,496,208 | B1 | 11/2016 | Ostrowicki |
| 2007/0161151 | A1 | 7/2007 | Madrid et al. |
| 2007/0290336 | A1* | 12/2007 | Sun ................... H01L 23/49524 257/735 |
| 2008/0087992 | A1 | 4/2008 | Shi et al. |
| 2009/0294934 | A1* | 12/2009 | Shi .................... H01L 23/49562 257/670 |
| 2013/0334695 | A1* | 12/2013 | Tijssen .................... H01L 23/48 257/773 |
| 2015/0206830 | A1* | 7/2015 | Takada .............. H01L 23/49562 257/676 |
| 2015/0279833 | A1* | 10/2015 | Dietl ................. H01L 23/49503 257/368 |
| 2015/0287666 | A1* | 10/2015 | Groenhuis ............. H01L 24/37 257/676 |
| 2016/0307826 | A1* | 10/2016 | McKnight-MacNeil .................... H01L 29/2003 |
| 2016/0336257 | A1* | 11/2016 | Choi ....................... H01L 24/40 |
| 2016/0358843 | A1* | 12/2016 | Arokiasamy ..... H01L 23/49513 |
| 2016/0377689 | A1* | 12/2016 | Babulano ............. G01R 33/091 324/252 |
| 2017/0250126 | A1* | 8/2017 | Ostrowicki ............. H01L 24/41 |

FOREIGN PATENT DOCUMENTS

| | | | |
|---|---|---|---|
| JP | 63100847 | U * | 6/1988 |
| JP | 2001127100 | A | 5/2001 |

OTHER PUBLICATIONS

James Huang, "Fabrication process & automation of power devices using Clip die bonder," President, 3S Silicon Tech., Inc.
Image A—Image of Alternative Design.
Image B—Image of Another Alternative Design.
Image C—Image of Yet Another Alternative Design.
European Search Report for corresponding application EP17196239 dated May 9, 2018, 2 pages.
European Search Opinion for corresponding application EP17196239 dated May 18, 2018, 10 pages.

* cited by examiner

SEMICONDUCTOR DEVICE AND METHOD WITH CLIP ARRANGEMENT IN IC PACKAGE

OVERVIEW

Aspects of various embodiments are directed to compact power packages as used with integrated circuits (ICs) and more particularly to clips used, in connection with and/or as part of the manufacturing of such ICs including circuits susceptible to surge currents. Many circuits are manufactured as part of an IC package in which operative circuitry is in a die and with the die be supported within the IC package by a lead frame. As the die is sometimes referred to as a chip, the IC package can also be referred to as a chip package.

Lead frames are typically thin metal structures used inside the IC or chip package that carries signals between the operative circuitry of the die and circuitry/regions outside the die. For example, in a semiconductor device which includes such an IC package with both a die and a power source, the power source can be connected to the operative circuitry in the die through such lead frames in the form of a thin layer of conductive metal. In this and related IC packages, the quality of the electrical connections between the lead frames and the die can be important for the overall performance and reliability of the resultant semiconductor device. This importance can track closely with the performance and reliability relying upon how well the lead-frame components are physically and electrically attached during the IC package assembly process.

The IC package assembly process used for manufacturing products which include such semiconductor devices can be particularly important to the reliability and practicable manufacturability of the overall product line, wherein each product is manufactured with such IC devices using chips produced in large batches on a single wafer of electronic-grade silicon (EGS) or other semiconductor material (e.g., GaAs). Using photolithography, for example, cut lines are defined on the wafer. Along these each chip can be separated from a single wafer by dicing the wafer into many pieces, with each piece being one such chip (or "raw chip") before it would become part of each IC package. A top/upper surface of the chip (or die) is prepared so as to make an electrical contact to an electrically conducting (e.g., Cu) clip, from which connections to lead frames and external circuits are made.

A common method to create such an electrical contact to the die is reflow soft-soldering, which is a process utilizing a solder paste which contains solder metal and a flux agent. Whether using reflow soft-soldering or another process, realizing quality-level electrical connections between the lead frames and the die in such an IC package has been challenging.

SUMMARY

Various example embodiments are directed to issues and involving semiconducting materials such as those discussed above and/or others which may become apparent from the following disclosure concerning the quality of electrical connections between the lead frames and the respective die in such integrated circuit (IC) packages.

More particular example embodiments concern such IC packages wherein the lead frame and the circuitry in the die is susceptible to power surges such as relatively high-level current pulses, whether occurring during the manufacturing process or post-manufacture operation. This situation can arise with many circuits such as in the above discussion and example wherein a power source is part of the IC device and power lines from the power source are connected to or part of the IC package and with lead frames, or similar structures, connecting the power lines to a top surface of the die. During the manufacture or operation of such semiconductor devices, high-level current pulses carried from the power lines can damage the circuitry in the die.

In more specific example embodiments, a circuit-based apparatus includes an IC package having a die, a lead frame, a conductor, and an electrically-conductive clip soldered so as to connect to a surface of the die. The die, which includes circuitry, is configured for electrically connecting to the lead frame via a surface area of the die. This surface area of the die has a non-solderable, passivating outer region along adjacent edges of the die surface, and has a solderable inner region arranged from a center portion of the surface up to inner region boundaries at which the solderable inner region ends and the outer region begins. The solderable inner region is shaped or configured with a width between opposing portions of the outer region, so as to be electrically coupled and secured to the conductor via solder. The electrically-conductive clip is configured to connect between the conductor and the circuitry of the die via a trough portion which is, in turn, part of a finger portion of the electrically-conductive clip. The finger portion of the clip has a length that extends across and toward the solderable inner region of the die, configured for connecting to the solderable inner region, and that extends beyond one of the inner region boundaries, thereby overlapping at least a portion of the outer region in one direction along a plane parallel to the surface area. The finger portion of the clip also has a width, along another different direction along the plane, that is less than the width of the solderable inner region.

More particular embodiments include optional features such as those discussed below which can be used alone or in combination as part of the above apparatus. One such feature concerns the width of the finger portion of the electrically-conductive clip. This width is configured and arranged to dissipate heat ensuing from a level of pulsed current carried to the clip sufficient to prevent the level of pulsed current from causing a portion of the solder to melt or to prevent part of the silicon front contact area to overheat and destroy. Another optional feature is the width of the finger portion being configured and arranged to provide, from a top-down perspective along a direction orthogonal to the plane, an inspection of at least part of the solderable inner region on at least one side of the finger portion of the electrically-conductive clip. Yet another optional feature is the width of the finger portion being configured and arranged to expose at least part of the solderable inner region on at least one side of the finger portion of the electrically-conductive clip for liquid-cleaning treatment, with that part of the solderable inner region being on at least one side of the finger portion exceeding about ten percent of the width of the solderable inner region.

According to other particular embodiments, such an apparatus can be implemented with a power source included and configured to provide power to the circuitry in the die via the conductor, and optionally with the circuitry in the die including a rectifier circuit and the power source configured to provide power to the rectifier circuit via the conductor.

In other specific example embodiments, the conductor is another lead frame which connects to other (external to the die) circuitry.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
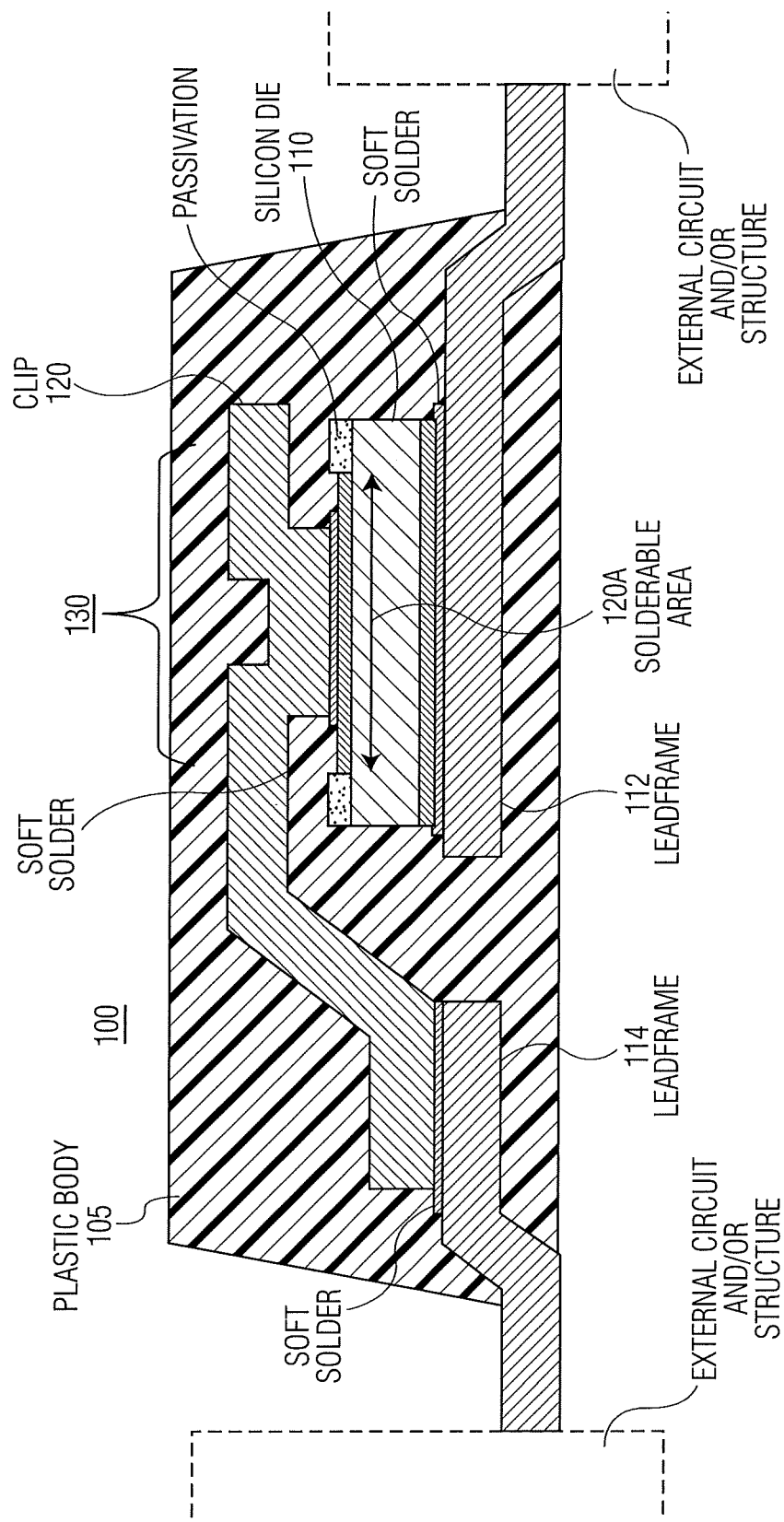
FIG. 1 is a diagram illustrating an example embodiment of a product including an IC package, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving integrated circuit (IC) packages. In certain implementations, aspects of the present disclosure have been shown to be beneficial when used in such contexts wherein lead frames are used to electrically and physically connect a die of the IC package with external circuitry (e.g., electrical lines, ports and other circuitry) which is outside of the die. In related manufacturing applications, certain embodiments as discussed below involve an IC package in which a clip arrangement is used to connect to a surface of the die in order to provide a highly-reliable connection with an ability to handle significant surge currents, provide exposure of the die surface for cleaning (e.g., as often needed) in an solder reflow process in which flux residue is removed after soldering, and/or also permit for visual inspection which can be important to assure that such residue is completely removed. While not necessarily so limited, various aspects may be appreciated through the following discussion of non-limiting examples which use exemplary contexts.

As generally characterized above, such exemplary contexts concern IC packages wherein the lead frame and the circuitry in the die are soldered at a surface area of the lead from and where the surface area is susceptible to excessive heat ensuing from power surges such as relatively high-level current pulses. This situation can arise, for example, when a power source is part of the IC package/device and power lines from the power source are connected to or part of the IC package and with lead frames, or similar structures, connecting the power lines to the die. During the manufacture of such semiconductor devices, high-level current pulses carried from the power lines heat to the point of undermining the quality of the electrical connection at the die surface and consequently, can undermine the ability and operation of the circuitry in the die.

Whether in these contexts and/or for other environments, specific example embodiments can provide advantages in connection with both the manufacturing process of the IC package as well as post-manufacture operation of the circuitry inside the die (and related circuitry operating in conjunction therewith). Using the above-described context in which the IC package has a die, a lead frame, a conductor, and an electrically-conductive clip soldered to connect to a surface of the die, one such exemplary circuit-based product includes the surface area of the die with an outer region along adjacent edges of the die surface, and with a solderable inner region arranged from a center portion of the surface up to the inner region boundaries at which the solderable inner region ends and the outer region begins. The solderable inner region is shaped or configured with a width between opposing portions of the outer region, so as to be electrically coupled and secured to the conductor via solder. The electrically-conductive clip is configured to connect between the conductor and the circuitry of the die via a trough portion which is, in turn, part of a finger portion of the electrically-conductive clip. The finger portion of the clip has a length that extends across and toward the solderable inner region of the die, configured for connecting to the solderable inner region, and that extends beyond one of the inner region boundaries, thereby overlapping at least a portion of the outer region in one direction along a plane parallel to the surface area. The finger portion of the clip also has a width (along another different direction along the plane) that is less than the width of the solderable inner region.

Advantages of embodiments using this extension (or finger) of the clip with a recessed member (or trough) extending over and beyond the solderable inner region are numerous and, among others: permitting for sufficient dissipation of heat from the finger portion of the clip so as to dissipate specified level of heat as may be important during the soldering process; and/or cleaning/inspection of the solderable inner region after the soldering process. Although not necessary for all implementations, for the most demanding applications, the finger portion is implemented with sufficient thermally-conductive mass for dissipating heat (e.g., copper or a copper alloy), with sufficient contact area via the trough for quality-level electrical connections to the circuitry in the die, and with an elongation that renders the finger portion sufficiently narrow such that on at least one side (preferably each side of the finger portion and all sides of the die-contacting trough region) of the solderable inner region is exposed for cleaning/inspection after the soldering process. While other shapes (e.g., oval, circular, polygonal) can be used, a rectangular or square-like shape of the die-contacting trough region can be beneficial when it tracks with the shape of the solderable inner region because all sides of the die-contacting trough region are then exposed cleaning/inspection after the soldering process, while at the same time permitting for sufficient contact area to the die surface and permitting for dissipation with sufficient thermally-conductive mass as discussed above. In various applications, the narrow width of the finger portion of the clip is (from a top-down perspective along a direction orthogonal to the plane along the surface of the die) is configured and arranged to expose the solderable inner region with at least 10-15% on each opposing side of the finger portion (for example, with the finger portion overlapping the solderable inner region by about 25-62% at a width dimension of the trough aligned along a center axis along the surface). In certain embodiments, the finger portion is elongated to extend at least 3-5% beyond the solderable inner region's far boundary (at the interface where the solderable inner region ends and the outer (periphery) region of the die surface begins).

In one experimental/application-specific example, non-limiting dimensions are illustrative, as follows. The surface of the solderable inner region is set in a range of 0.85 mm²-0.95 mm² (e.g., square with each x/y dimension in this range). The overlapping width of the finger portion (at a width dimension of the trough) is in a range of 0.40 mm-0.50 mm, and the finger portion is elongated to extend beyond the far boundary of the solderable inner region (e.g., 0.005 mm-0.010 mm, 0.008 mm-0.013 mm, or 0.010 mm-0.020 mm). For some applications, wherein real estate within the IC package is not a concern, the elongation of the finger portion can extend even further than such examples above. In any event, this experimental/application-specific example embodiment provides for sufficient thermal dissipation, with the trough contacting the solderable inner region across 45-55% of its width and with 22-25% exposure of the solderable inner region (taking into account exposure of the opposing sides of the finger portion).

In the following further description of various specific details relating to these above contexts, the skilled artisan would appreciate that one or more other examples and/or variations of these disclosed examples may be practiced without implementing or relying upon such specific details as given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

It will also be appreciated that certain terms used in the examples are not to be construed as limiting in the most strict possible contexts. One example concerns orientation terminology, such as upper/lower, left/right, top/bottom and above/below, as these terms may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Turning now to the specific embodiments as illustrated for purposes of facilitating discussion, FIG. 1 is a diagram in accordance with the present disclosure which illustrates an example embodiment with the relevant portions of a circuit-based product including an IC package 100 with operative circuitry inside a protective (e.g., plastic) body 105 in which a circuitry-containing die 110 is secured. Accordingly, a circuit-based product or device includes the IC package 100 which has the die 110, and various other components/aspects including a lead frame structure with first and second lead frames 112, 114 (either of which can also be implemented more generically as another type of conductor), and an electrically-conductive clip 120 soldered so as to connect to the top surface of the die 110. The die 110 is electrically connected to the second lead frame 112 via at a solderable inner region 120A of the top surface area, which can be considered a subset of the overall top surface area. An outer region of the surface area can be seen extending along adjacent edges of the die surface (e.g., along two or four edges of a four-sided upper surface area), with the solderable inner region 120A being defined from a center portion of the surface up to inner region boundaries at which the solderable inner region ends and the outer region begins. The solderable inner region is shaped or configured with a width between opposing portions of the outer region, so as to be electrically coupled and secured to the conductor via solder. The electrically-conductive clip is configured to connect between the conductor and the circuitry of the die via a trough portion which is, in turn, part of a finger portion 130 of the electrically-conductive clip 120. The finger portion has a length (as shown from left to right of FIG. 1) that extends across and toward the solderable inner region of the die. The finger portion 130 is also configured for connecting to the solderable inner region 120A, such that it extends beyond one of the inner region boundaries (e.g., the far-end boundary) and thereby overlapping at least a portion of the outer region in one direction along a plane parallel to the surface area. The finger portion 130 also has a width, seen from a perspective along another different (e.g., perpendicular) direction along the plane, that is less than the width of the solderable inner region.

Figure 2:
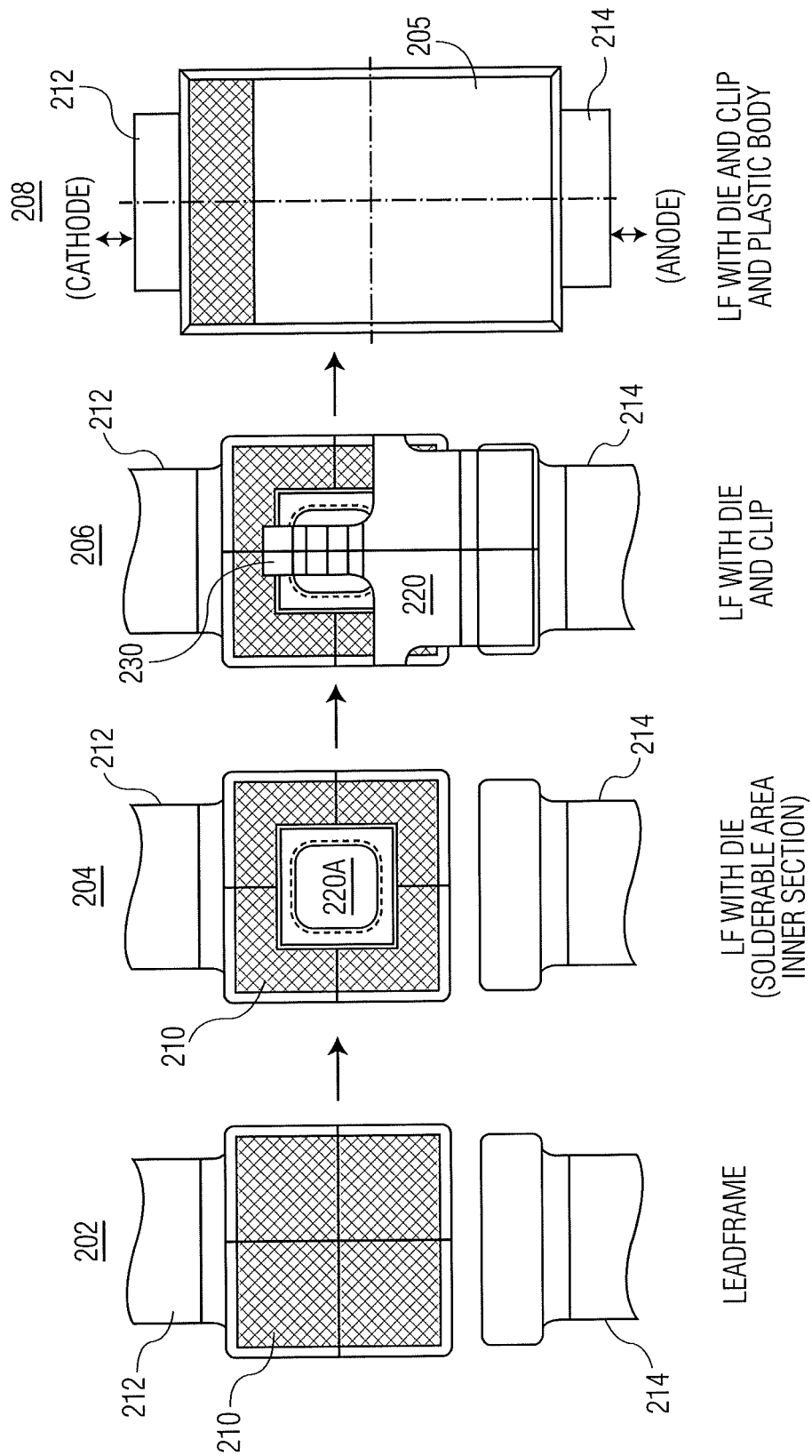
FIG. 2 is a flow diagram illustrating an exemplary set of stages of assembly or manufacturing of a circuit-based product including an IC package implemented in a manner consistent with FIG. 1 and/or other embodiments referred to herein, in accordance with the present disclosure.

FIG. 2 is a flow diagram illustrating an exemplary set of stages of assembly or manufacturing of a circuit-based product for a single junction rectifier using an IC package implemented in a manner consistent with FIG. 1 and/or other embodiments referred to herein, in accordance with the present disclosure. At stages 202 and 204, lead frames 212 and 214 are shown as die 210 is processed with a square-shaped surface corresponding to a solderable inner region 220A. At stage 206, clip 220 (with finger portion 230) is connected between lead frame 214 and the solderable inner region (or section) 220A. At stage 208, the components shown in stage 206 are shown encapsulated or housed in plastic body 205, and with illustration of the single junction rectifier (circuitry) in the die 210 including and/or connected to lead frame 212 at a cathode side and the lead frame 214 at the anode side.

Figure 3:
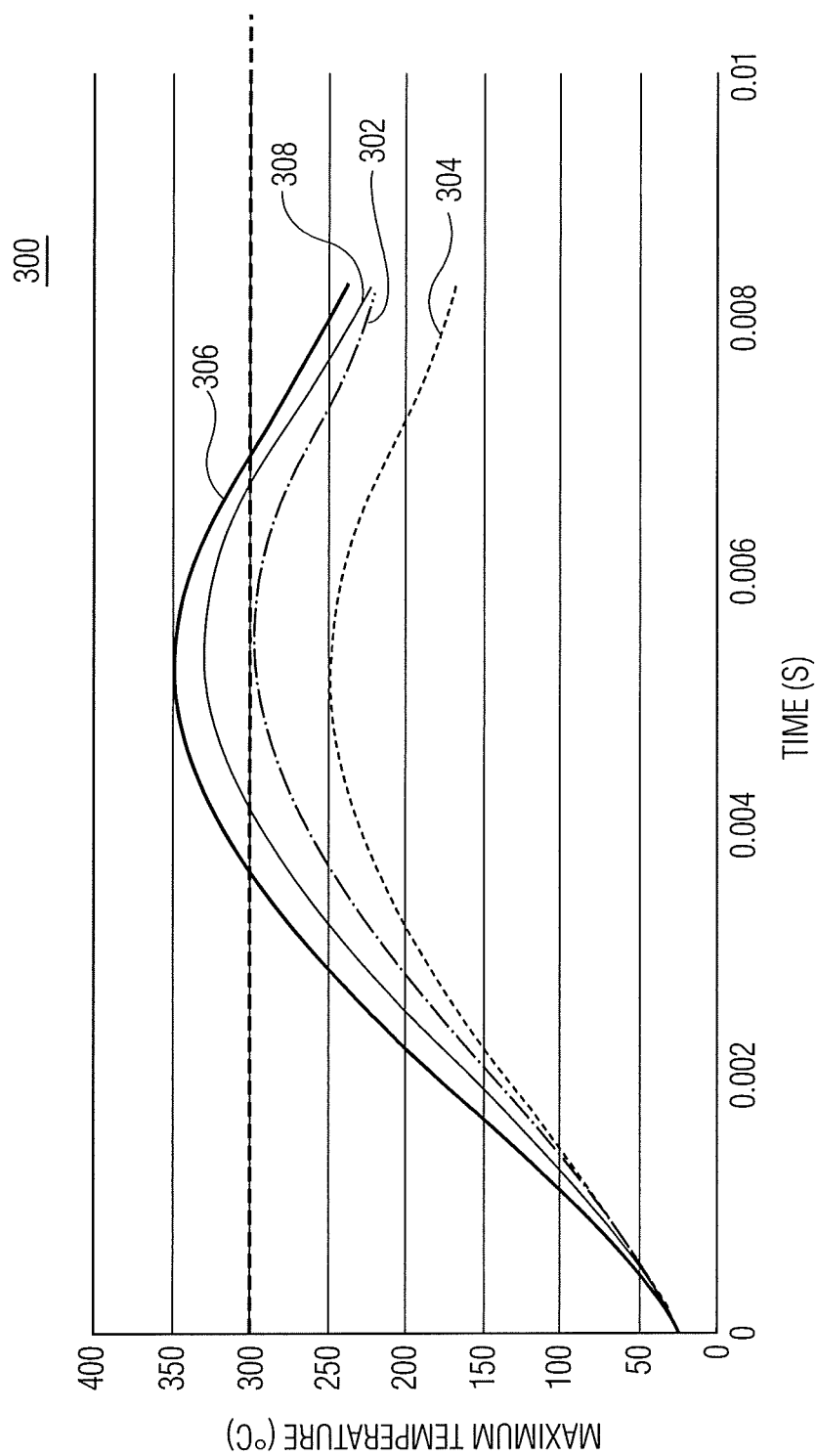
FIG. 3 is a plot illustrating, for a particular ID packaging example and for a given set of manufacturing conditions, significant performance advantages of embodiments implemented consistent with the present disclosure.

FIG. 3 is a plot illustrating, for a particular IC packaging example and for a given set of manufacturing conditions and assuming a surge current of 60 A. This plot shows significant and surprising performance advantages in connection with certain of the above of embodiments of the present disclosure. Consistent with such above-described embodiments and using one particular non-limited embodiment with dimensions as in the experimental/application-specific example described above (e.g., 0.90 square-shaped solderable inner region and with trough contacting the solderable inner region across 45-55% of its width), each of the noted advantages was realized and including more than adequate inspection and cleaning and with sufficient thermal dissipation as shown in the plotted line 302 of FIG. 3 for the above-described experimental/application-specific embodiment as compared to other plotted lines 304, 306 and 308 as corresponding to alternative implementations that do not employ such advantageous features (e.g., narrowed and extended finger portion as characterized hereinabove).

The plot, with these plotted lines, show the melting point of the solder material (PbSn5Ag2.5), which should not be exceeded if possible; the dashed line illustrates this limit as being 300° C. The forward surge current requirement (maximum (peak or surge) forward current or IFSM) for rectifier diodes is the robustness against an 8.3-10 ms sine wave shaped forward current pulse. It is needed for the usage (e.g., in switch mode power supplies). The test currents can be very high (e.g., surge current of greater than about 30 A-45 A), such that substantial power is dissipated in the junction area of the circuitry in the die. While wire-bonded devices fail due to a melting metal wire, clip bonded devices commonly fail in the silicon due to overheat. The reason for this is the very short pulse length, which does not allow the heat to spread very far in this timeframe. Accordingly the silicon contact or the contact solder will melt and cause an irreversible destruction of the device. Embodiments consistent with the present disclosure increase the IFSM rating by increasing the heat capacitance of the material surrounding the junction (e.g., the silicon or the clip contact on the front side), while permitting for sufficient inspection and/or cleaning after the solder reflow.

In considering constructions of such die-contacting clips, if inspection/cleaning were not important, the construction could maximize the heat dissipating aspects by all or a vast majority of the solderable inner region being contacted (e.g., extending over the entire width of the inner region) by the clip. This alternative approach provides more than sufficient heat dissipation, as illustrated by the plotted line 304 (corresponding to such an oversized clip overhanging on the clip-opposing side with the additional thermal mass which is not electrically active), with the addition of this overhang being able to reduce the peak temperature as illustrated.

Alternative small clip designs (e.g., a narrowed finger reaching down to contact the inner region boundary but without the far end of the trough leading to the extension which goes beyond the inner region boundary) leads to a peak temperature in the range of 330-350° C., thereby exceeding the 300° C. limit. This illustrated result occurs even with the thickness of the clip being increased locally around the die-contact area. Consistent with the advantages discussed herewith in connection with the above-described embodiments, plotted line 302 corresponds to the above-described experimental/application-specific example, thereby illustrating use of the clip's narrowed finger reaching down to contact the inner region boundary and with the far end of the trough leading to the extension of the clip which goes beyond the inner region boundary. This plotted line 302 shows the temperature rise being limited to below 300° C.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, node, element and component are understood to refer to circuitry and/or semiconductive regions of circuitry as described herein. Such circuits or circuitry are used together with other elements to exemplify how certain embodiments may be carried out in the form or structures, steps, functions, operations, activities, etc. In certain embodiments, such illustrated items represent a more complex process/algorithm as described in connection with the manufacture of a product including the above-described construction and through which related steps and manufacturing operations are performed such as those in connection with solder reflow, etc. The specification may also make reference to an adjective that does not connote any attribute of the structure ("first [type of structure]" and "second [type of structure]") in which case the adjective is merely used for English-language antecedence to differentiate one such similarly-named structure from another.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims

What is claimed is:

1. An apparatus comprising:
   an integrated circuit (IC) package including a lead frame and a conductor;
   a die having circuitry and electrically connected to the lead frame;
   a surface area of the die having an outer non-solderable passivation region along adjacent edges of the die surface, and having a solderable inner region arranged from a center portion of the surface up to inner region boundaries at which the solderable inner region ends and the outer non-solderable passivation region begins, wherein the solderable inner region is configured with a width between opposing portions of the outer non-solderable passivation region, and is electrically coupled and secured to the conductor via solder; and
   an electrically-conductive clip connected between the conductor and the circuitry of the die via a trough portion in a finger portion of the electrically-conductive clip, the finger portion having a length that extends across and toward the solderable inner region of the die and with the trough portion connected to a die contact trough region of the solderable inner region, and the finger portion extending beyond a far boundary of one of the inner region boundaries and thereby overlapping at least a portion of the outer non-solderable passivation region in a first direction along a plane parallel to the surface area, wherein the finger portion has a bottom surface that extends beyond the far boundary and is parallel to the surface area, wherein the finger portion is sufficiently narrow such that on all sides of the die contact trough region, the inner solderable region is exposed after soldering,
   wherein the finger portion of the electrically-conductive clip has a width, along another second direction perpendicular to the first direction along the plane, that is less than the width of the solderable inner region, and wherein the width of the finger portion of the clip, from a top-down perspective along a direction orthogonal to the plane, is configured and arranged to expose the solderable inner region with at least 10% on each opposing side of the finger portion.

2. The apparatus of claim 1, wherein the width of the finger portion of the electrically-conductive clip is configured and arranged to dissipate heat ensuing from a level of pulsed current carried to the clip sufficient to prevent the level of pulsed current from causing a portion of the solder to melt or the die surface to overheat and to degrade.

3. The apparatus of claim 1, wherein the width of the finger portion of the electrically-conductive clip is configured and arranged to provide, from a top-down perspective along a direction orthogonal to the plane, an inspection of at least part of the solderable inner region on at least one side of the finger portion of the electrically-conductive clip, and further configured and arranged to expose at least part of the solderable inner region on at least one side of the finger portion of the electrically-conductive clip for liquid-cleaning treatment, said at least part of the solderable inner region on at least one side of the finger portion exceeding ten percent of the width of the solderable inner region.

4. The apparatus of claim 1, wherein the width of the finger portion of the electrically-conductive clip is configured and arranged to permit, from a top-down perspective along a direction orthogonal to the plane, an inspection of at least part of the solderable inner region on at least one side of the finger portion of the electrically-conductive clip.

5. The apparatus of claim 1, wherein the finger portion of the electrically-conductive clip is sufficiently narrow to permit, from a top-down perspective, an inspection of respective portions of the solderable inner region on each side of the finger portion of the electrically-conductive clip.

6. The apparatus of claim 1, further including a power source configured to provide power to the circuitry in the die via the conductor.

7. The apparatus of claim 1, further including a power source, and wherein the circuitry in the die includes a rectifier circuit and the power source is configured to provide power to the rectifier circuit via the conductor.

8. The apparatus of claim 1, wherein the conductor is another lead frame.

9. The apparatus of claim 1, further including a first external circuit and a second external circuit each configured for conducting current outside the die, and further including a power source configured to provide powered to the circuitry in the die via the conductor.

10. The apparatus of claim 1, wherein the width of the finger portion of the clip, from the top-down perspective along a direction orthogonal to the plane, is configured and arranged to expose the solderable inner region with at least 10-15% on each opposing side of the finger portion.

11. The apparatus of claim 1, wherein the finger portion of the clip, from a top-down perspective along a direction orthogonal to the plane, is configured and arranged to overlap the solderable inner region by about 25-62% at a width dimension of the trough.

12. The apparatus of claim 1, wherein the finger portion of the clip is elongated to extend at least 3% beyond the far boundary of the solderable inner region where the solderable inner region ends and an outer periphery region of the die surface begins.

13. The apparatus of claim 1, wherein the finger portion of the clip is elongated to extend at least 5% beyond the far boundary of the solderable inner region where the solderable inner region ends and an outer periphery region of the die surface begins.

14. The apparatus of claim 1, wherein the finger portion of the clip is sufficiently elongated to dissipate heat generated by a surge current load, characterized by an 8.3-10 ms sine wave shaped forward current pulse, of greater than 30 A.

15. The apparatus of claim 1, wherein the finger portion of the clip is sufficiently elongated to dissipate heat generated by a surge current load, characterized by an 8.3-10 ms sine wave shaped forward current pulse, of greater than 40 A.

16. A method for the integrated circuit (IC) package of claim 1 including a semiconductor die with circuitry and including at least one lead frame, the method comprising:
conducting electricity between the circuitry in the die and the lead frame via an electrically-conductive clip, wherein the die includes a surface area having an outer non-solderable passivation region along adjacent edges of the die surface, and having a solderable inner region arranged from a center portion of the surface area up to inner region boundaries at which the solderable inner region ends and the outer non-solderable passivation region begins, wherein the solderable inner region has a width between opposing portions of the outer non-solderable passivation region for electrically coupling and securing to a conductor via solder;
while passing current through the clip, dissipating heat as generated by the current by using a trough portion in a finger portion of the clip, the finger portion of the clip having a length that extends from the lead frame across and toward the solderable inner region of the die and connecting to a die contact trough region of the solderable inner region, wherein the finger portion extends beyond a far boundary of one of the inner region boundaries and thereby overlaps at least a portion of the outer non-solderable passivation region in a first direction along a plane parallel to the surface area, wherein the finger portion has a bottom surface that extends beyond the far boundary and is parallel to the surface area, and wherein the finger portion is sufficiently narrow such that on all sides of the die contact trough region, the inner solderable region is exposed after soldering; and
wherein the step of dissipating heat employs the finger portion of clip having a width, along a second direction perpendicular to the first direction along the plane, that is less than the width of the solderable inner region.

* * * * *